(12) United States Patent
Ichihara et al.

(10) Patent No.: US 9,928,908 B2
(45) Date of Patent: Mar. 27, 2018

(54) RESISTANCE-CHANGE MEMORY OPERATING WITH READ PULSES OF OPPOSITE POLARITY

(71) Applicant: Toshiba Memory Corporation, Minato-ku (JP)

(72) Inventors: Reika Ichihara, Yokohama (JP); Daisuke Matsushita, Fujisawa (JP); Shosuke Fujii, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/425,388

(22) Filed: Feb. 6, 2017

(65) Prior Publication Data

US 2017/0148516 A1    May 25, 2017

Related U.S. Application Data

(60) Division of application No. 14/621,071, filed on Feb. 12, 2015, now Pat. No. 9,601,192, which is a division
(Continued)

(30) Foreign Application Priority Data

Mar. 23, 2011   (JP) ................................. 2011-064933

(51) Int. Cl.
*G11C 11/00*   (2006.01)
*G11C 13/00*   (2006.01)
(Continued)

(52) U.S. Cl.
CPC ...... *G11C 13/0069* (2013.01); *G11C 11/5614* (2013.01); *G11C 13/004* (2013.01);
(Continued)

(58) Field of Classification Search
CPC ............ G11C 13/0011; G11C 11/5614; G11C 13/004; G11C 13/0069; G11C 13/0097; G11C 13/0004
See application file for complete search history.

(56) References Cited

U.S. PATENT DOCUMENTS

| | | |
|---|---|---|
| 6,992,920 B2 | 1/2006 | Tamai et al. |
| 7,535,746 B2 | 5/2009 | Kawazoe et al. |

(Continued)

FOREIGN PATENT DOCUMENTS

| | | |
|---|---|---|
| CN | 101171642 A | 4/2008 |
| JP | 2005-32401 A | 2/2005 |

(Continued)

OTHER PUBLICATIONS

International Search Report dated Dec. 13, 2011 for PCT/JP2011/071769 filed on Sep. 16, 2011 in English.
(Continued)

*Primary Examiner* — Kretelia Graham
(74) *Attorney, Agent, or Firm* — Oblon, McClelland, Maier & Neustadt, L.L.P.

(57) ABSTRACT

According to one embodiment, a resistance-change memory includes a memory cell and a control circuit. The memory cell comprises first and second electrodes, and a variable resistance layer disposed between the first electrode and the second electrode. The control circuit applies a voltage between the first electrode and the second electrode to perform writing, erasing, and reading. During the writing, the control circuit applies a first voltage pulse between the first electrode and the second electrode, and then applies a second voltage pulse different in polarity from the first voltage pulse after applying the first voltage pulse.

7 Claims, 21 Drawing Sheets

Related U.S. Application Data of application No. 14/016,614, filed on Sep. 3, 2013, now Pat. No. 9,053,786, which is a continuation of application No. PCT/JP2011/071769, filed on Sep. 16, 2011, now abandoned.

(51) Int. Cl.
*H01L 27/24* (2006.01)
*H01L 45/00* (2006.01)
*G11C 11/56* (2006.01)

(52) U.S. Cl.
CPC ...... *G11C 13/0004* (2013.01); *G11C 13/0007* (2013.01); *G11C 13/0011* (2013.01); *G11C 13/0097* (2013.01); *H01L 27/2409* (2013.01); *H01L 45/1233* (2013.01); *H01L 45/142* (2013.01); *G11C 2013/005* (2013.01); *G11C 2013/009* (2013.01)

(56) References Cited

U.S. PATENT DOCUMENTS

| | | | |
|---|---|---|---|
| 8,467,227 B1* | 6/2013 | Jo | G11C 13/0007 365/148 |
| 2004/0197947 A1* | 10/2004 | Fricke | G11C 13/0004 438/102 |
| 2006/0268595 A1 | 11/2006 | Bill et al. | |
| 2007/0115714 A1 | 5/2007 | Muraoka et al. | |
| 2008/0025070 A1 | 1/2008 | Horii et al. | |
| 2008/0259678 A1 | 10/2008 | Muraoka et al. | |
| 2009/0014707 A1 | 1/2009 | Lu | |
| 2009/0129190 A1* | 5/2009 | Ikkink | G11C 11/5678 365/218 |
| 2009/0154222 A1 | 6/2009 | Chien | |
| 2009/0201710 A1 | 8/2009 | Ueda | |
| 2010/0008132 A1 | 1/2010 | Hwang et al. | |
| 2010/0177559 A1 | 7/2010 | Chen | |
| 2010/0265750 A1 | 10/2010 | Yan et al. | |
| 2011/0110144 A1 | 5/2011 | Kawai et al. | |
| 2011/0128773 A1 | 6/2011 | Azuma et al. | |

FOREIGN PATENT DOCUMENTS

| | | |
|---|---|---|
| JP | 2007-4873 | 1/2007 |
| JP | 2007-4873 A | 1/2007 |
| JP | 2012-9124 A | 1/2012 |
| KR | 10-2008-0069336 | 7/2008 |
| TW | 200636726 A | 10/2006 |
| TW | 200908295 | 2/2009 |
| TW | 200952228 A1 | 12/2009 |
| TW | 201027533 A1 | 7/2010 |
| WO | WO 2006/130438 A1 | 12/2006 |
| WO | WO 2010/125805 A1 | 11/2010 |
| WO | WO 2010/143414 A1 | 12/2010 |

OTHER PUBLICATIONS

International Written Opinion dated Dec. 13, 2011 for PCT/JP2011/071769 filed on Sep. 16, 2011 in English.
Christophe J. Chevallier, et al., A 0.13pm 64Mb Multi-Layered Conductive Metal-Oxide Memory, IEEE International Solid-State Circuits Conference, Session 14 (2010), pp. 260-261.
Kuk-Hwan Kim, et al., Nanoscale Resistive Memory with Intrinsic Diode Characteristics and Long Endurance, Applied Physics Letters 96, 053106 (2010).
Japanese Office Action dated Jul. 16, 2013 in Patent Application No. 2011-064933 with English Translation.
Office Action dated Sep. 25, 2014 in Taiwanese Office Action No. 100133608 (with English translation).
Office Action dated Nov. 28, 2014 in Korean Patent Application No. 10-2013-7022749 (with English translation).
Xiao Sun, et al, "Resistive Switching in $CeO_x$ Films for Nonvolatile Memory Application", IEEE Electron Device Letters, vol. 30/No. 4, Apr. 2009, pp. 334-336.
Combined Office Action and Search Report dated Feb. 4, 2015 in Chinese Patent Application No. 201180068942.8 (w/ English language translation).
Extended European Search Report dated Jan. 30, 2015 in Patent Application No. 11861820.6.
Chinese Office Action dated Sep. 17, 2015 in Patent Application No. 201180068942.8 (w/ English language translation).
Combined Office Action and Search Report dated Apr. 21, 2016 in Taiwanese Patent Application No. 104123087 (w/English translation).

* cited by examiner

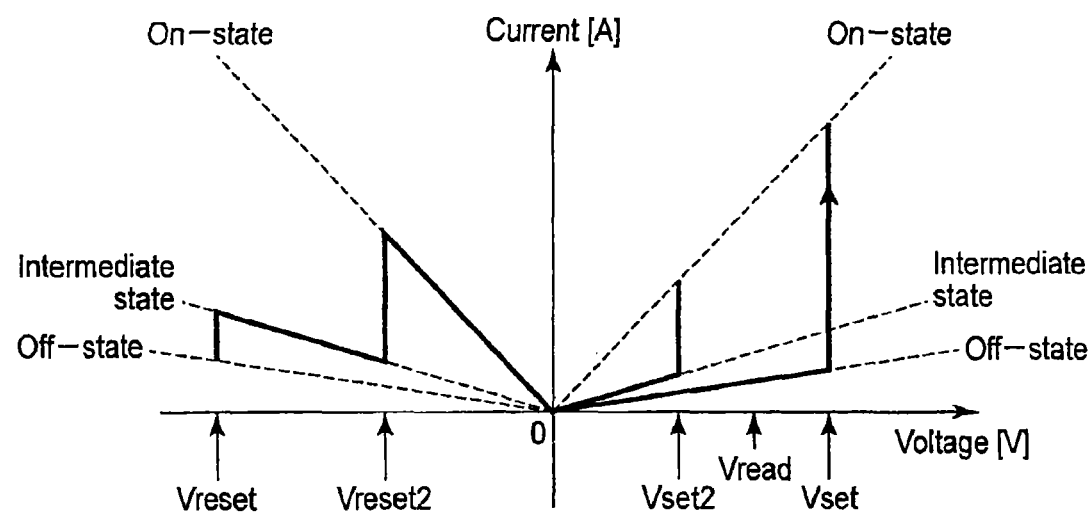
F I G. 1

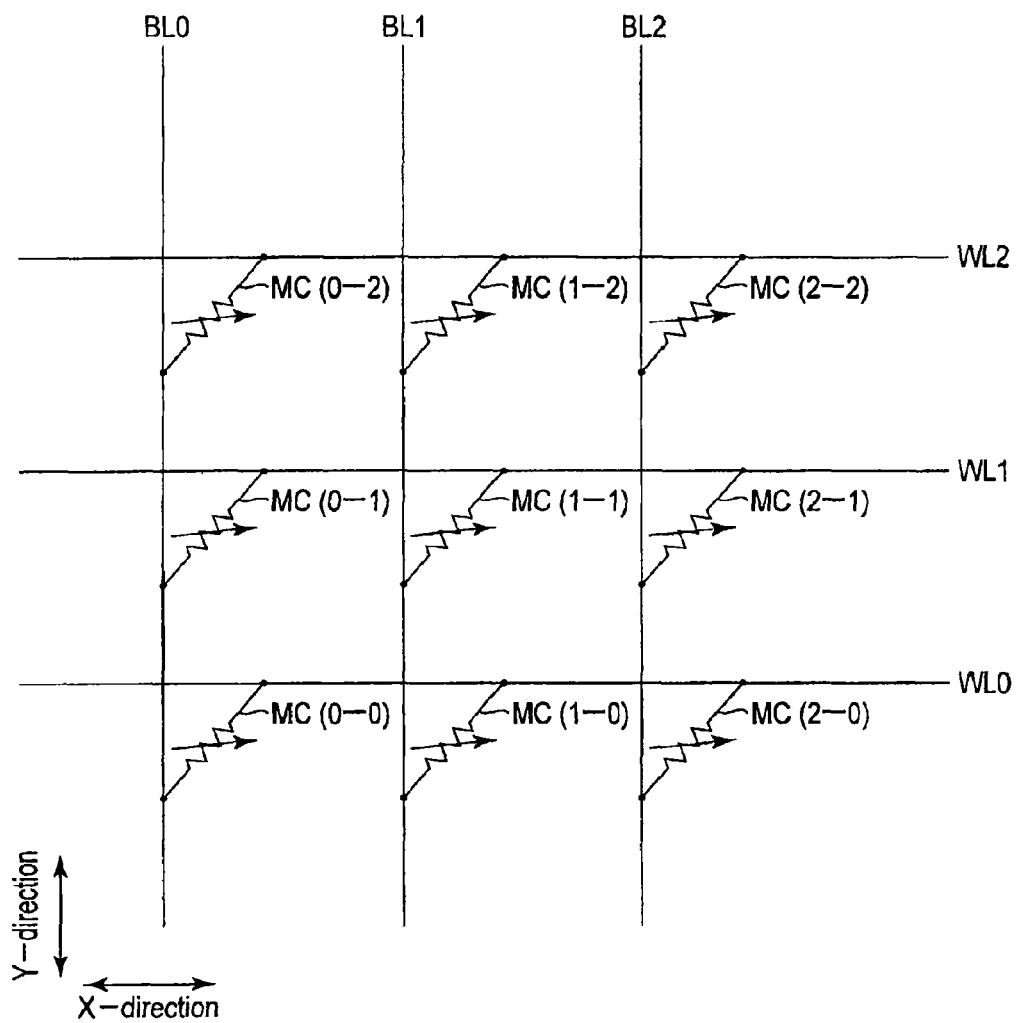
F I G. 2

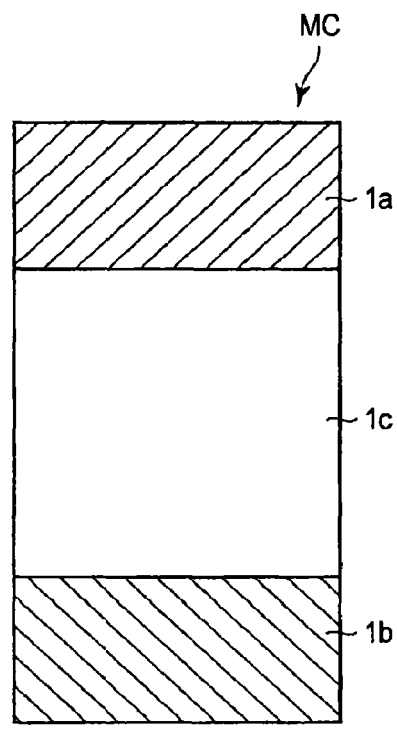
F I G. 3
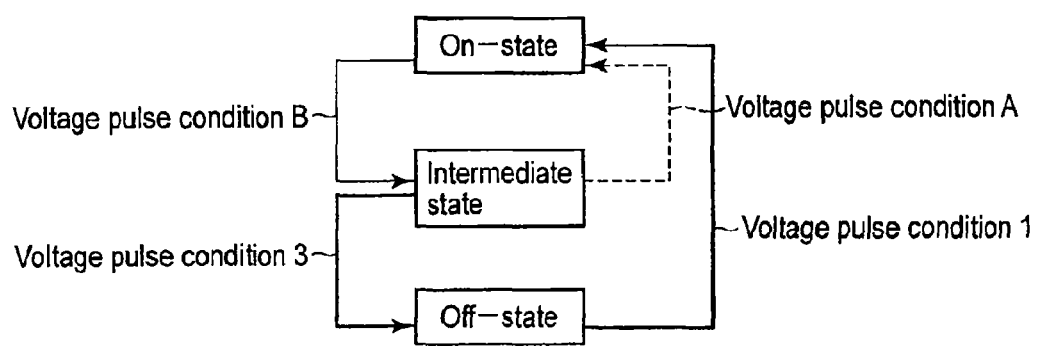
F I G. 4 A

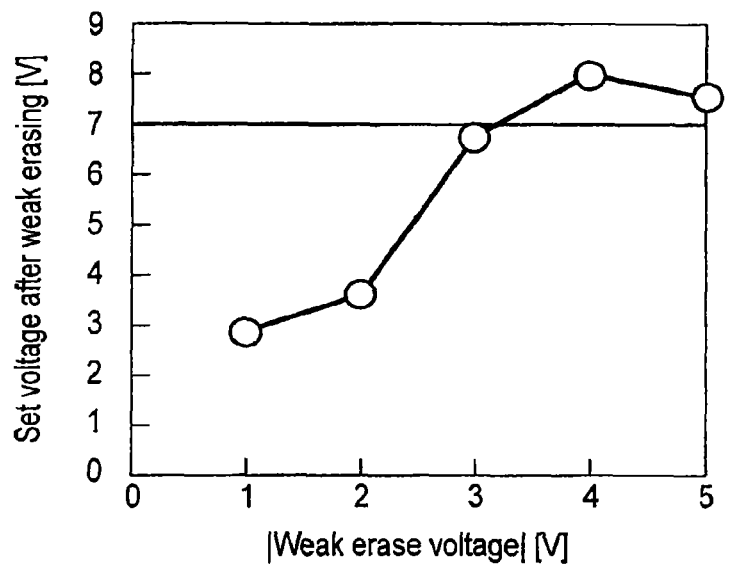
F I G. 1 1 A
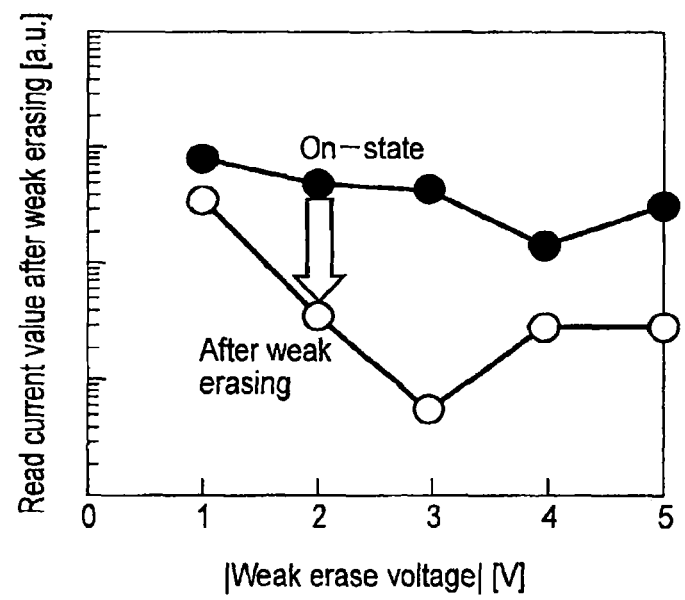
F I G. 1 1 B

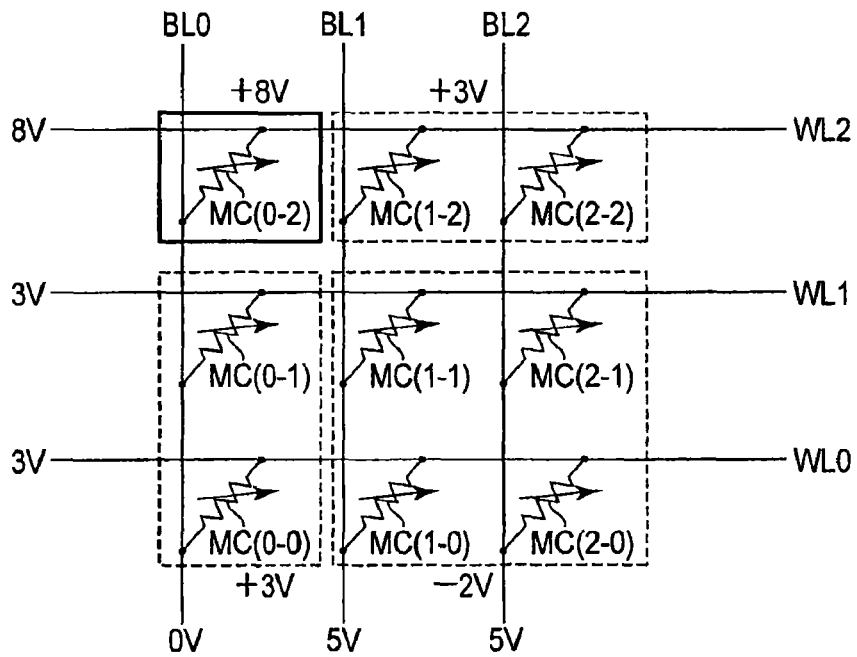
F I G. 1 3 A
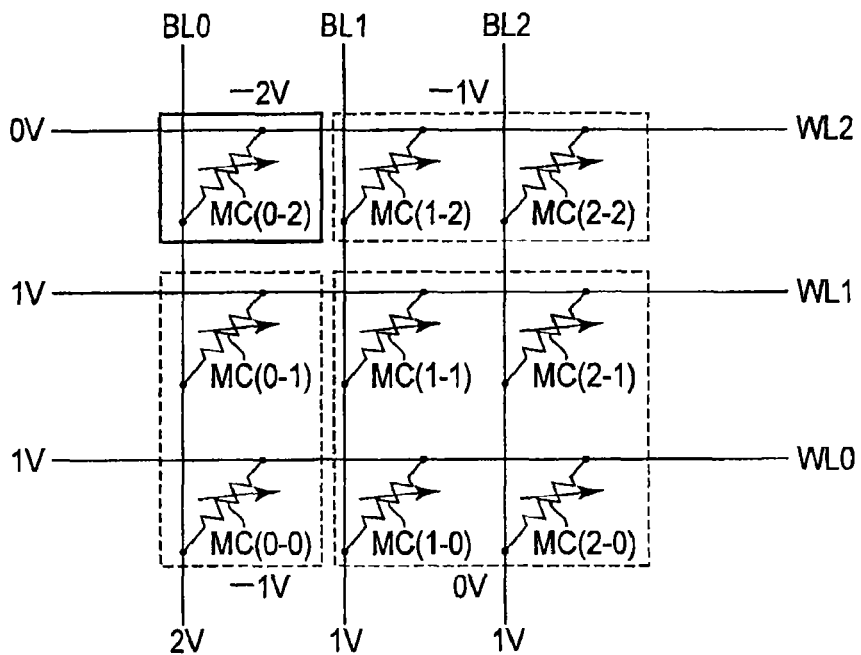
F I G. 1 3 B

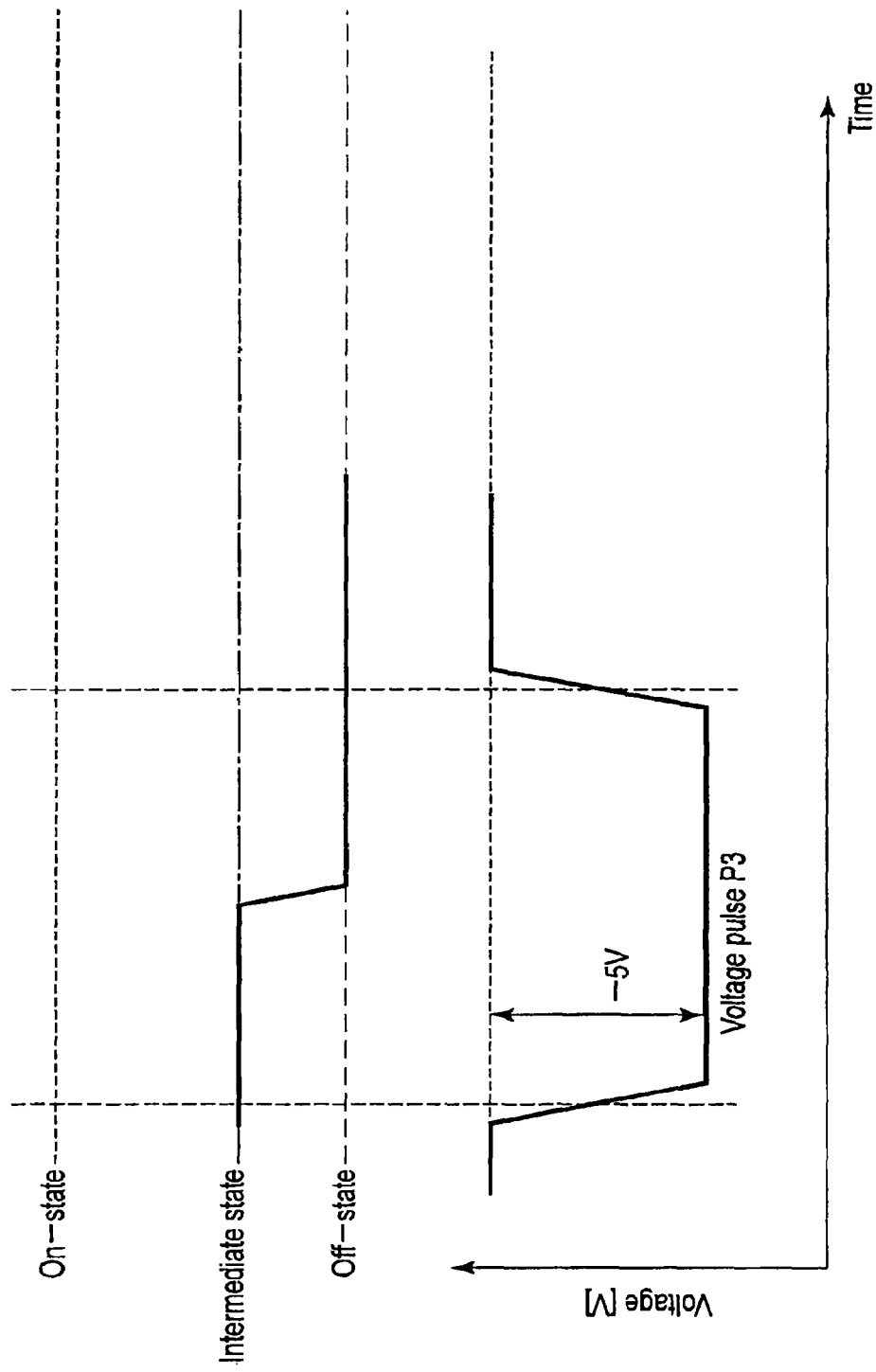
F I G. 14

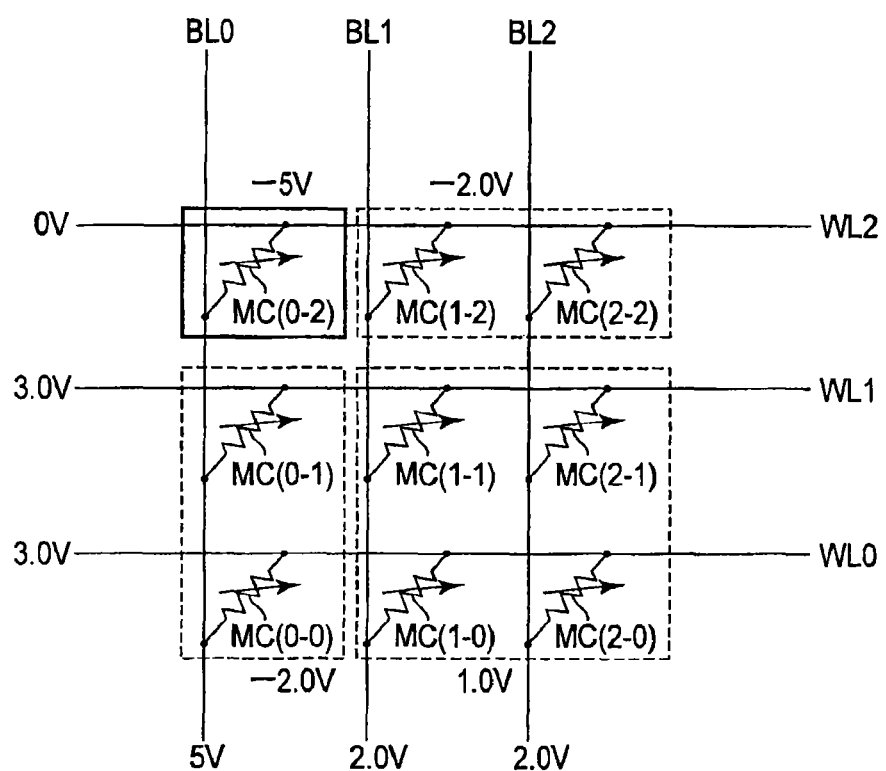
F I G. 15

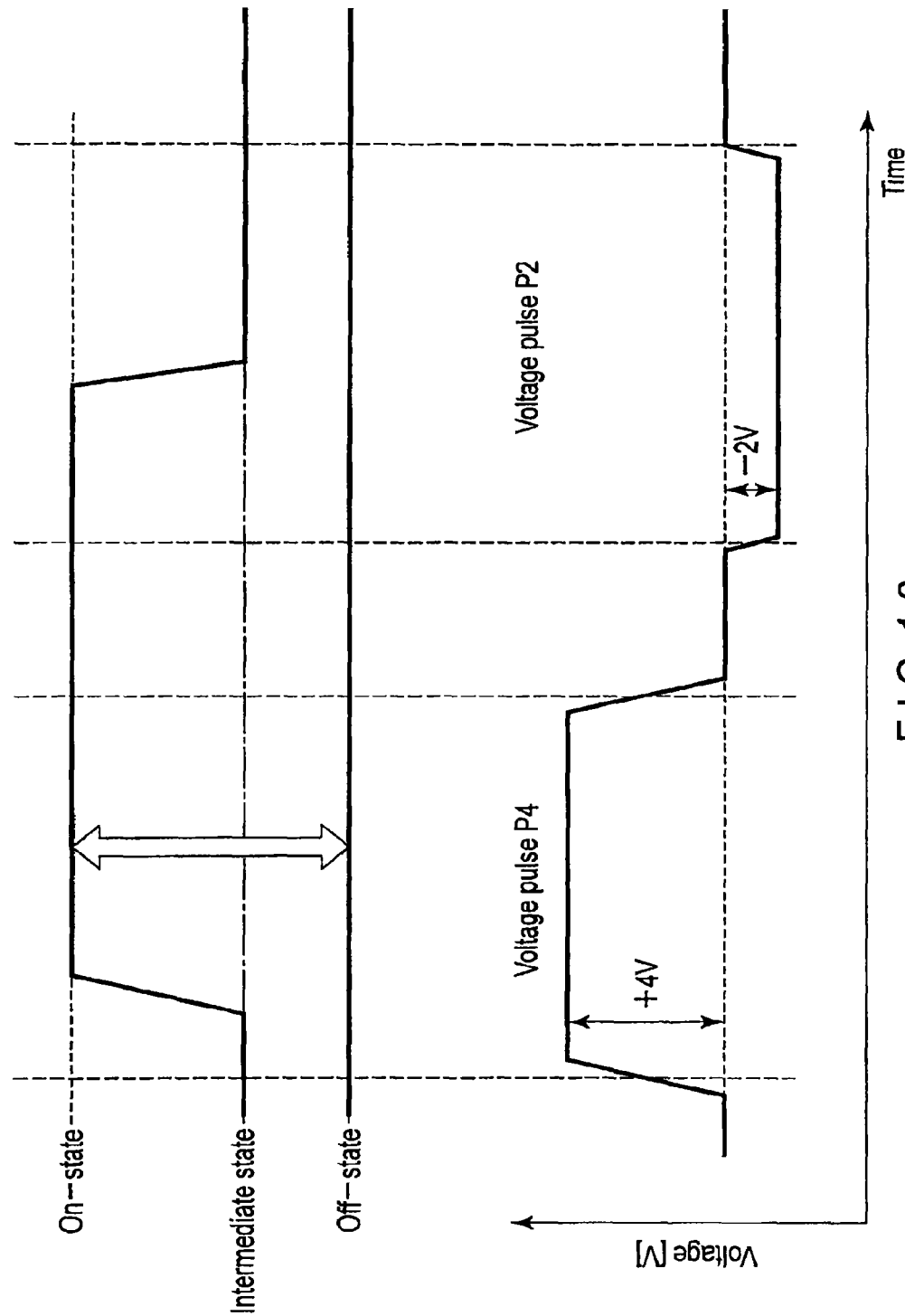
F I G. 16

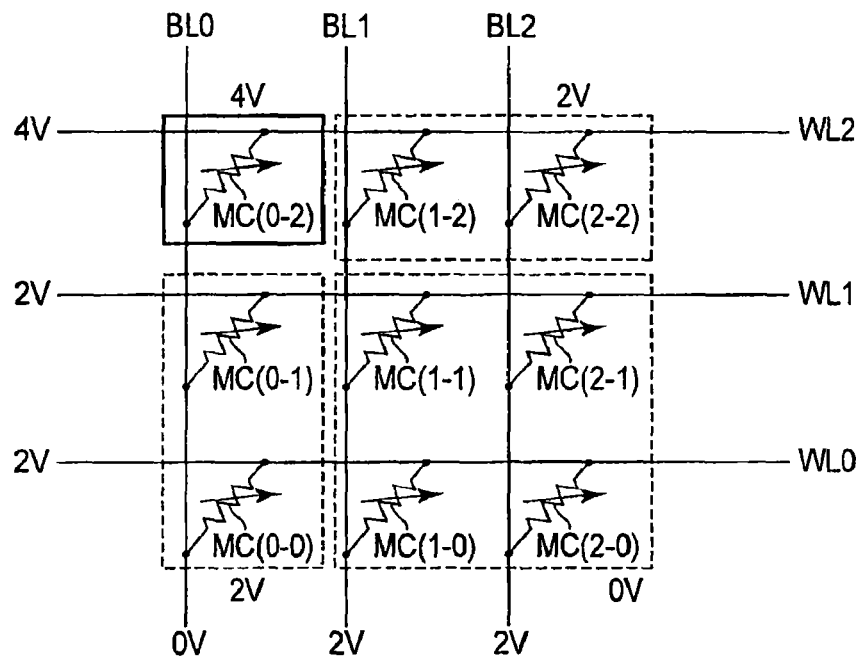
F I G. 17 A
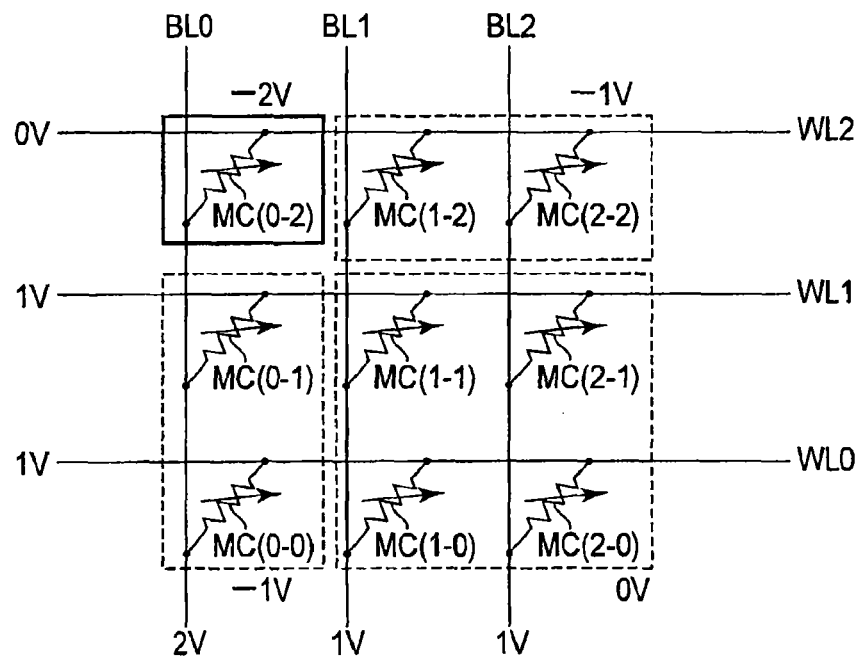
F I G. 17 B

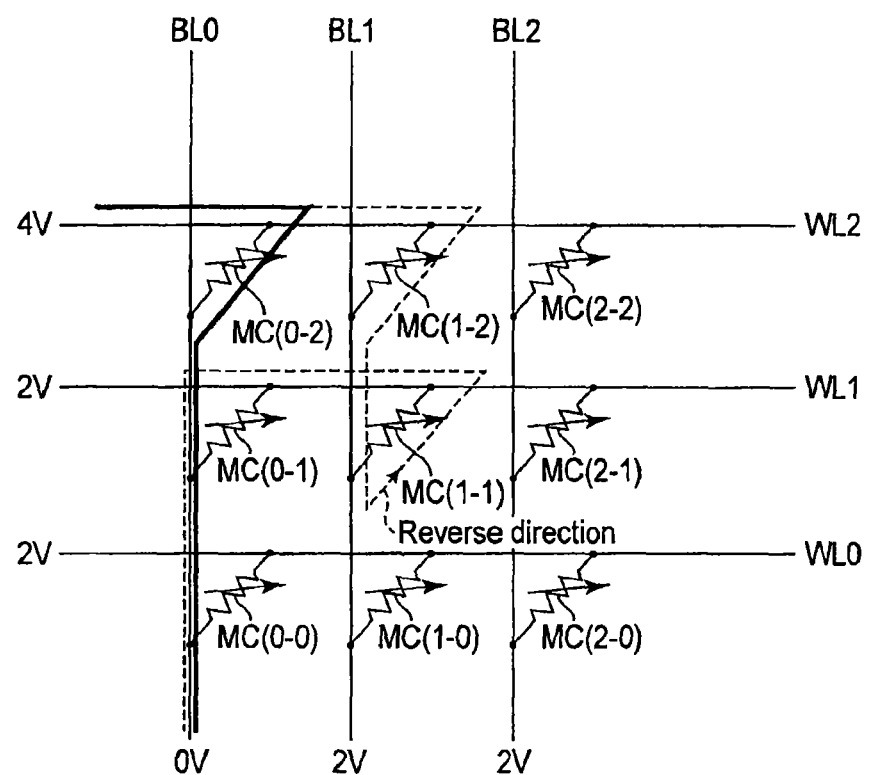
F I G. 1 8

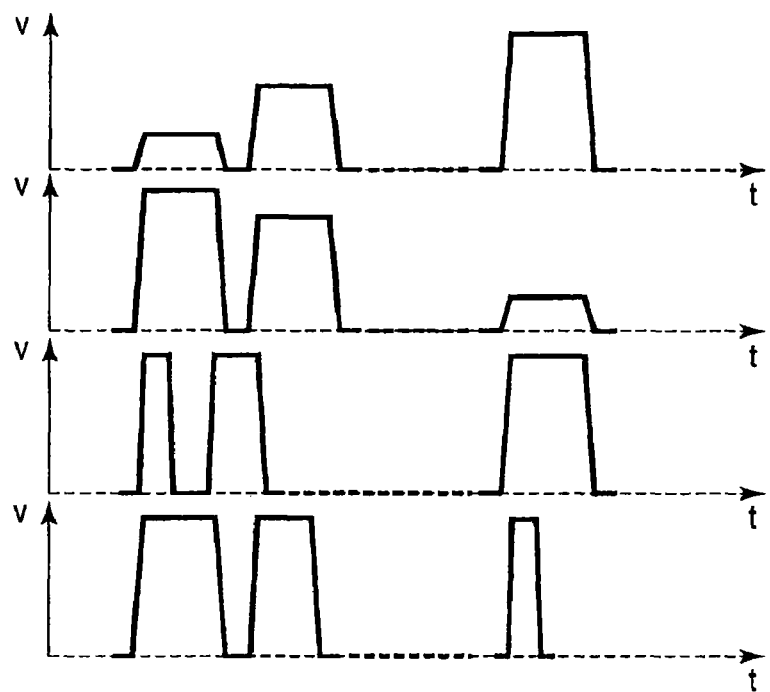
F I G. 1 9
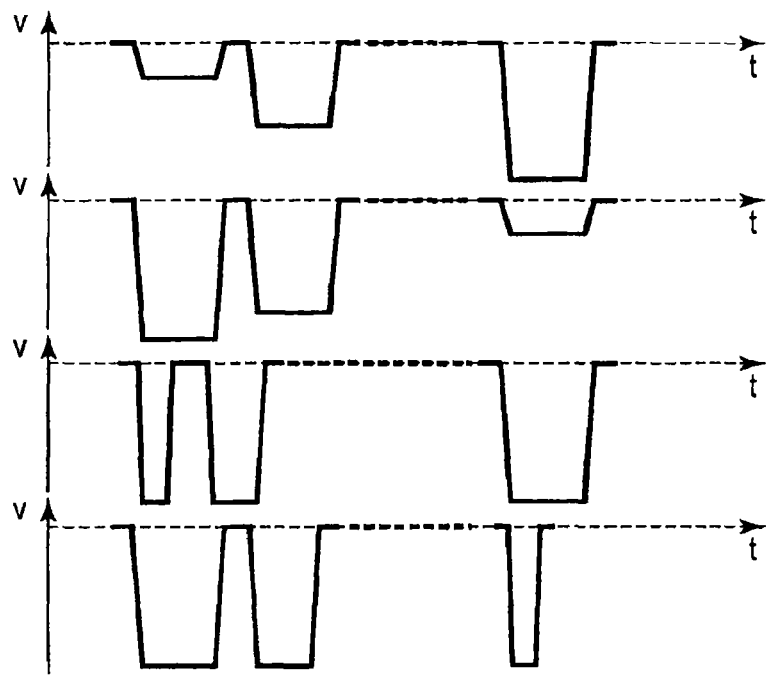
F I G. 2 0

US 9,928,908 B2

RESISTANCE-CHANGE MEMORY OPERATING WITH READ PULSES OF OPPOSITE POLARITY

CROSS REFERENCE TO RELATED APPLICATIONS

This application is a division of and claims the benefit of priority under 35 U.S.C. §120 from U.S. Ser. No. 14/621,071 filed Feb. 12, 2015, which is a division of U.S. Ser. No. 14/016,614 filed Sep. 3, 2013 (now U.S. Pat. No. 9,053,786 issued Jun. 9, 2015), which is a continuation application of PCT Application No. PCT/JP2011/071769 filed Sep. 16, 2011 and claims the benefit of priority from Japanese Patent Application No. 2011-064933 filed Mar. 23, 2011, the entire contents of each of which are incorporated herein by reference.

FIELD

Embodiments described herein relate generally to a resistance-change memory.

BACKGROUND

Recently, a resistance-change memory has been attracting attention as a candidate to succeed a semiconductor memory.

The resistance-change memory is characterized in that the resistance of a resistance-change film is changed by the application of a voltage pulse to store data therein in a nonvolatile manner. The resistance-change memory is a two-terminal element and is simple in structure. The advantage of the resistance-change memory is that a higher capacity can be obtained more easily than heretofore by constructing a cross-point memory cell array.

In the cross-point type, a selective element needs to be connected in series to a resistance-change element in each memory cell. In a unipolar resistance-change memory in which voltage pulses in writing and erasing have the same polarity, a diode is needed. In a bipolar resistance-change memory in which voltage pulses in writing and erasing have opposite polarities, a so-called selector is needed to suppress a current in a voltage region lower than a threshold voltage in both polarities.

In a cross-point resistance-change memory, when a current in an on-state exponentially increases with an applied voltage, the current in an on-state is much more suppressed in a low voltage region than in a high-voltage region. This can be used to suppress a sneak current running through unselected memory cells without the installation of the selector.

However, even in such a resistance-change memory in which an on-current exponentially increases with an applied voltage, it is difficult to sufficiently suppress the sneak current running through unselected memory cells.

BRIEF DESCRIPTION OF THE DRAWINGS

FIG. 1 shows a typical current-voltage characteristic of a resistance-change element according to an embodiment;

FIG. 2 is a diagram showing a memory cell array structure in a resistance-change memory according to the embodiment;

FIG. 3 is a diagram showing the configuration of the memory cell (resistance-change element) shown in FIG. 1;

FIG. 4A is a diagram showing the state transition of the resistance-change element dependent on voltage pulse conditions according to the embodiment;

FIG. 11A is a graph showing the voltage necessary for the transition to an on-state after the application of a weak erase voltage;

FIG. 11B is a graph showing the weak erase voltage dependence of a read current after the application of a weak erase voltage;

FIGS. 13A and 13B are diagrams showing a write operation in the memory cell array according to the embodiment;

FIG. 14 is a graph showing the state transition of the resistance-change element and an applied voltage in erasing according to the embodiment;

FIG. 15 is a diagram showing an erase operation in the memory cell array according to the embodiment;

FIG. 16 is a graph showing the state transition of the resistance-change element and an applied voltage in reading according to the embodiment;

FIGS. 17A and 17B are diagrams showing a read operation in the memory cell array according to the embodiment;

FIG. 18 is a graph showing a sneak current generated in a cross-point memory cell array; and FIGS. 19, 20 and 21 are graphs showing the waveform of a voltage applied to the resistance-change element according to the embodiment.

DETAILED DESCRIPTION

Figure 4B:
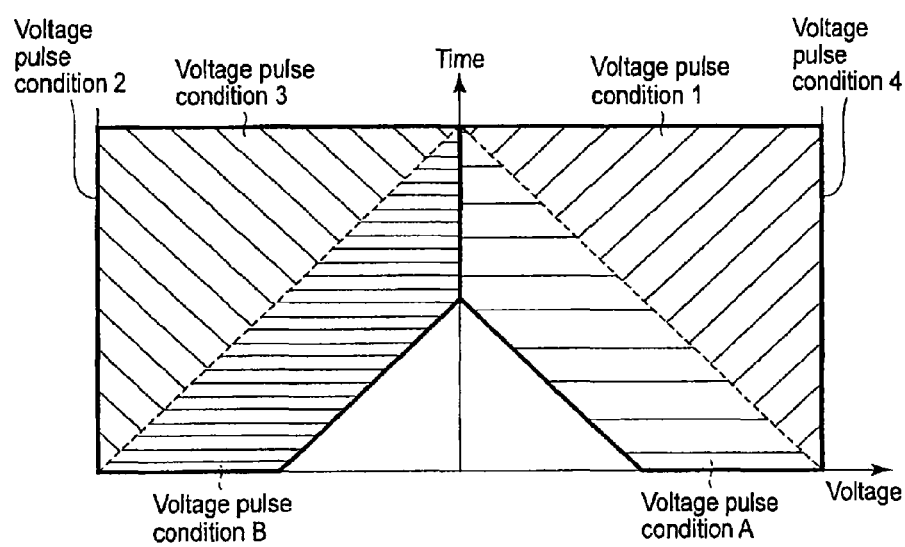
FIG. 4B is a graph showing the voltage pulse conditions according on voltage and time to the embodiment.

Hereinafter, a resistance-change memory according to embodiments is described with reference to the drawings. It is to be noted that components having the same function and configuration are given the same reference signs throughout the following explanation and are repeatedly described only when necessary.

In general, according to one embodiment, a resistance-change memory includes a memory cell and a control circuit. The memory cell comprises first and second electrodes, and a variable resistance layer disposed between the first electrode and the second electrode. The control circuit applies a voltage between the first electrode and the second electrode to perform writing, erasing, and reading. During the writing, the control circuit applies a first voltage pulse between the first electrode and the second electrode, and then applies a second voltage pulse different in polarity from the first voltage pulse after applying the first voltage pulse.

Concept of the Embodiments

First, the concept of the embodiments is described.

The resistance-change memory according to the embodiments has a resistance-change element that changes in resistance. The resistances (e.g. two high resistances [off] and low resistances [on]) of the resistance-change element are programmed by a current or a voltage. The resistance-change memory stores data in accordance with the resistance of the resistance-change element.

FIG. 1 shows a typical current-voltage characteristic of the resistance-change element according to the embodiment.

As shown, when a positive-direction voltage is applied to the resistance-change element in an off-state, resistance decreases after the voltage exceeds a certain (Vset), and the resistance-change element makes the transition to an on-state.

Furthermore, when a negative-direction voltage is applied to the resistance-change element in the on-state, the resistance-change element again increases in resistance. The process of this resistance increase occurs step by step depending on the applied voltage. For example, when the negative-direction voltage is applied up to Vreset2, the resistance-change element does not completely return to the off-state, and remains in an intermediate state. The intermediate state is a state higher in resistance than the on-state.

Moreover, if the negative-direction voltage is applied to the resistance-change element in the intermediate state up to Vreset, the resistance-change element makes the transition to the off-state from the intermediate state. Here, when the positive-direction voltage is applied, the resistance-change element makes the transition to the on-state from the intermediate state at a voltage Vset2 lower than a voltage Vset at which the resistance-change element makes the transition to the on-state from the off-state. The intermediate state is higher in resistance than the on-state, and has a resistance less than or equal to the off-state.

In the resistance-change element having such characteristics, setting to the intermediate state instead of the on-state is defined as "write", setting to the off-state is defined as "erasing", and a read voltage is greater than or equal to Vset2 and less than Vset. Thus, it is possible to add a function substantially similar to that when a selector is installed in the resistance-change element as a memory cell.

First Embodiment

A resistance-change memory according to the first embodiment is described. Here, a cross-point resistance-change memory is described as the resistance-change memory by way of example.

[1] Memory Array

FIG. 2 is a diagram showing a memory cell array structure in the resistance-change memory according to the first embodiment.

As shown, the memory cell array is in a cross-point form. Word lines WL0, WL1, and WL2 extend in an X-direction, and are arranged at predetermined intervals in a Y-direction. Bit lines BL0, BL1, and BL2 extend in the Y-direction, and are arranged at predetermined intervals in the X-direction.

Memory cells MC(0-0), (0-1), . . . , (2-2) are arranged at the intersections of word lines WL0, WL1, and WL2 and bit lines BL0, BL1, and BL2. In this way, the resistance-change memory has a cross-point memory cell array structure. Later-described resistance-change elements are used for the memory cells.

Although the memory cell array in which the resistance-change elements are arranged between the word lines and the bit lines is shown here, a stack memory cell array structure in which the memory cell arrays are stacked may be used.

[2] Resistance-Change Element

FIG. 3 is a diagram showing the configuration of a memory cell (resistance-change element) MC shown in FIG. 1.

As shown in FIG. 3, the resistance-change element MC has a first electrode $1a$, a second electrode $1b$, and a variable resistance layer $1c$. The variable resistance layer $1c$ is disposed between the first electrode $1a$ and the second electrode $1b$. The resistance-change element MC can take at least different three states (an on-state, an off-state, and an intermediate state).

First, voltage pulse conditions that permit the transition between the three states are classified as follows. Here, the voltage pulse conditions mean the polarity, amplitude, and width of a voltage pulse.

a. Voltage Pulse Condition 1

This voltage pulse condition permits the transition to the on-state from the off-state or the intermediate state.

b. Voltage Pulse Condition 2

This voltage pulse condition permits the transition to the intermediate state from the on-state.

c. Voltage Pulse Condition 3

This voltage pulse condition permits the transition to the off-state from the on-state or the intermediate state.

d. Voltage Pulse Condition 4

This voltage pulse condition permits the transition to the on-state from the intermediate state.

The above-mentioned on-state, off-state, and intermediate state have the following relationship.

The intermediate state and the off-state are higher in resistance than the on-state.

There is a voltage pulse condition (referred to as "condition A") which is included in voltage pulse condition 4 but not included in voltage pulse condition 1. That is, there is a voltage pulse condition which permits the transition to the on-state from the intermediate state but which does not permit the transition to the on-state from the off-state.

There is a voltage pulse condition (referred to as "condition B") which is included in voltage pulse condition 2 but not included in voltage pulse condition 3. That is, there is a voltage pulse condition which permits the transition to the intermediate state from the on-state but which does not permit the transition to the off-state.

FIG. 4B schematically shows voltage pulse conditions 1, 2, 3, 4, A, and B. Voltage pulse condition 4 includes the region of voltage pulse condition A and the region of voltage pulse condition 1. Voltage pulse condition 2 includes the region of voltage pulse condition B and the region of voltage pulse condition 3.

Generally speaking, as shown in FIG. 4B, these voltage pulse conditions are determined by the voltage (amplitude and polarity) and time (pulse width) of a voltage pulse. As apparent, the state transition of the resistance-change element is not only dependent on voltage but also dependent on time. Therefore, write, erase, and read operations can be performed by the product of the voltage (pulse amplitude and polarity) and the time (pulse width).

However, in some cases, the state transition of the resistance-change element is basically dependent on voltage or time. Therefore, at least one of the pulse amplitude and the pulse width of the third voltage pulse is greater than that of the second voltage pulse. Similarly, at least one of the pulse amplitude and the pulse width of the fourth voltage pulse is smaller than that of the first voltage pulse.

If the state transition of the resistance-change element is dependent on voltage rather than time, Voltage pulse conditions 1, 2, 3, 4, A, and B may be decided only by the voltage (amplitude and polarity).

For example, in case of some resistance-change elements, voltage and time required for the state transition has a relationship described in formula (1).

$$\text{Voltage} \propto 1/\log(\text{time}) + k \qquad \text{formula (1)}$$

In this case, it's desirable to use the voltage (amplitude and polarity) as the pulse conditions of the operation. That is, the pulse amplitude of the third voltage pulse is greater than that of the second voltage pulse. Similarly, the pulse amplitude of the fourth voltage pulse is smaller than that of the first voltage pulse.

In the same way, if the state transition of the resistance-change element is dependent on time rather than voltage, it's desirable to use the time (pulse width) as pulse conditions of the operation.

[3] Writing, Erasing, and Reading

Write, erase, and read operations in the resistance-change element according to the embodiment are described.

(1) Writing

Figure 5A:
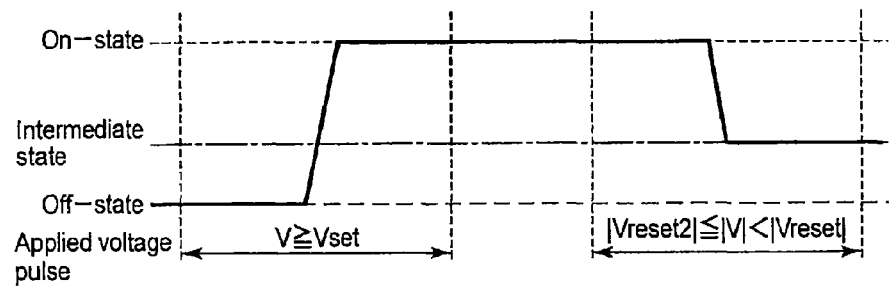
FIG. 5A is a graph showing the state transition of the resistance-change element in writing according to the embodiment.

FIG. 5A is a graph showing the state transition of the resistance-change element in writing. As shown in FIG. 5A, in writing, the resistance-change element makes the transition to the intermediate state.

Figure 5B:
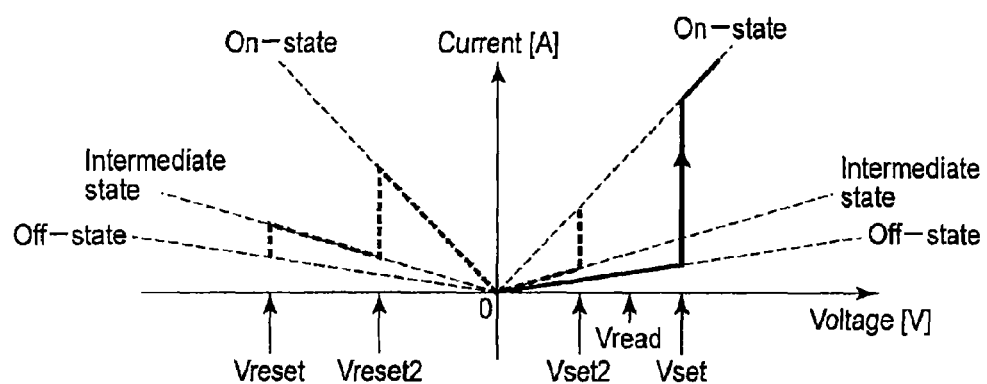
FIGS. 5B and 5C are graphs showing the current-voltage characteristic of the resistance-change element in writing according to the embodiment.
Figure 5C:
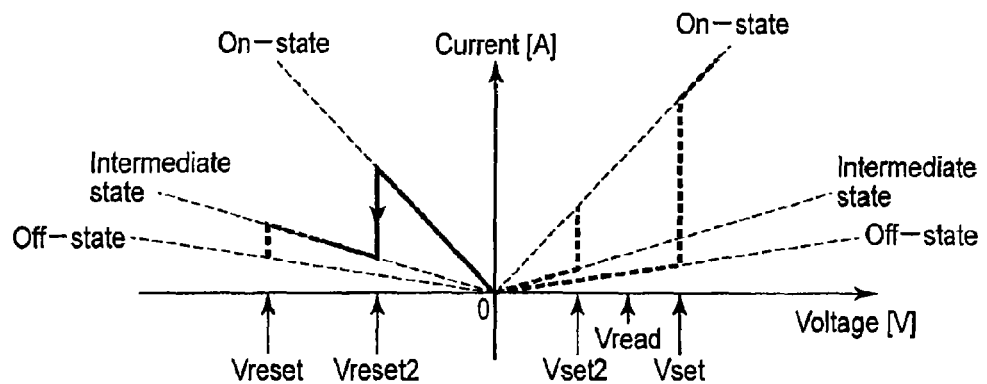

More specifically, as shown in FIG. 5B, a positive voltage greater than or equal to voltage Vset is applied as a voltage pulse of voltage pulse condition 1 to make the transition to the on-state from the off-state. Subsequently, as shown in FIG. 5C, a negative voltage having an absolute value greater than or equal to |Vreset2| and less than |Vreset| is applied as a voltage pulse of voltage pulse condition B to make the transition to the intermediate state from the on-state.

(2) Erasing

Figure 6A:
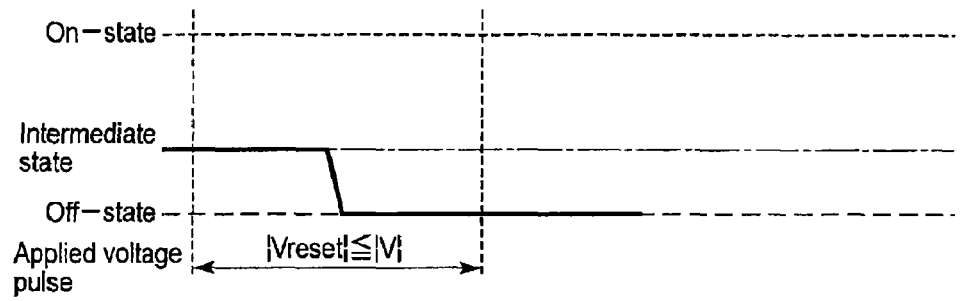
FIG. 6A is a graph showing the state transition of the resistance-change element in erasing according to the embodiment.
Figure 6B:
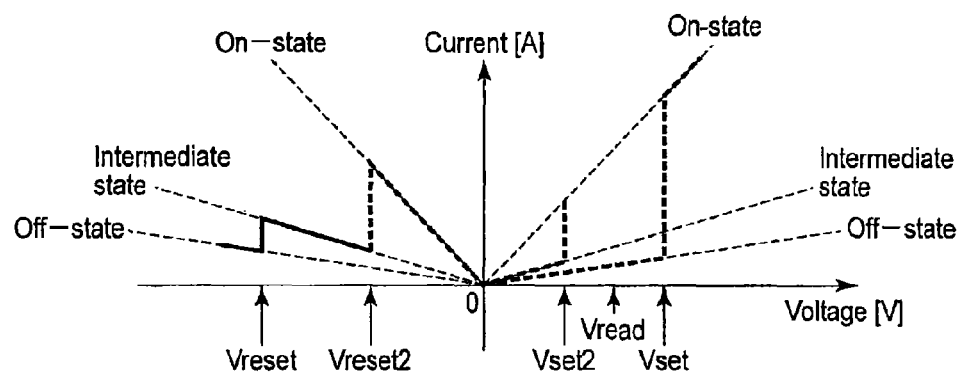
FIG. 6B is a graph showing the current-voltage characteristic of the resistance-change element in erasing according to the embodiment.

FIG. 6A is a graph showing the state transition of the resistance-change element in erasing. As shown in FIG. 6A, in erasing, the resistance-change element makes the transition to the off-state from the intermediate state. More specifically, as shown in FIG. 6B, a negative voltage having an absolute value greater than or equal to |Vreset| is applied as a voltage pulse of voltage pulse condition 3 to make the transition to the off-state from the intermediate state.

(3a) Reading 1

Figure 7A:
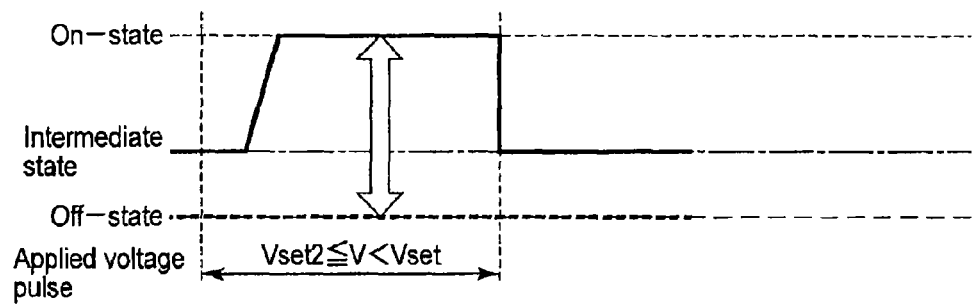
FIG. 7A is a graph showing the state transition of the resistance-change element in reading (1) according to the embodiment.

FIG. 7A is a graph showing the state transition of the resistance-change element in reading. This reading is used when the resistance-change element in the intermediate state automatically returns to the intermediate state after the end of the application of the read voltage.

Figure 7B:
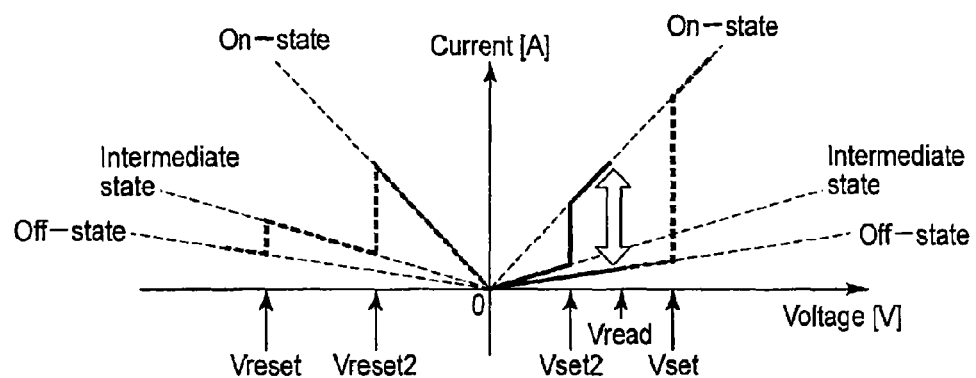
FIG. 7B is a graph showing the current-voltage characteristic of the resistance-change element in reading (1) according to the embodiment.

As shown in FIG. 7B, in reading, a positive voltage greater than or equal to Vset2 and less than Vset is applied as a voltage pulse of voltage pulse condition A.

When a resistance-change element targeted for reading is in the intermediate state (when the resistance-change element is an element in which data has been written), the resistance-change element instantaneously makes the transition to the on-state from the intermediate state if the positive voltage is applied thereto, and a current in the on-state is read. After the application of the positive voltage is finished, the resistance-change element returns to the intermediate state from the on-state.

When the resistance-change element targeted for reading is in the off-state (when the resistance-change element is an element in which data has been erased), the resistance-change element maintains the off-state, and a current in the off-state is read.

(3b) Reading 2

Figure 8A:
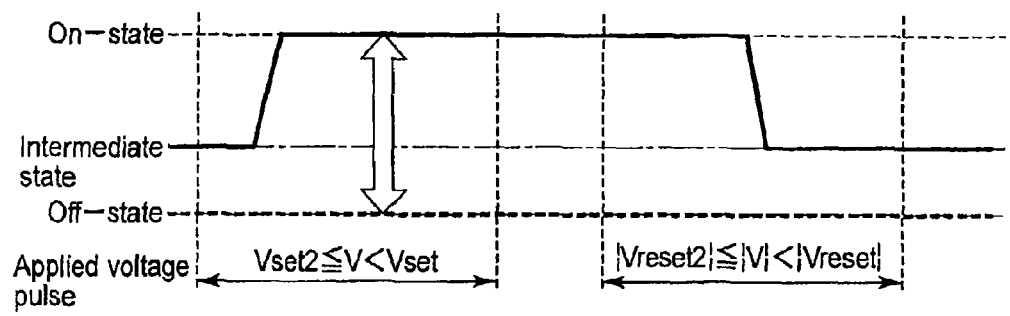
FIG. 8A is a graph showing the state transition of the resistance-change element in reading (2) according to the embodiment.

FIG. 8A is a graph showing the state transition of the resistance-change element in different reading. This reading is used when the resistance-change element in the intermediate state does not return to the intermediate state after the end of the application of the read voltage.

Figure 8B:
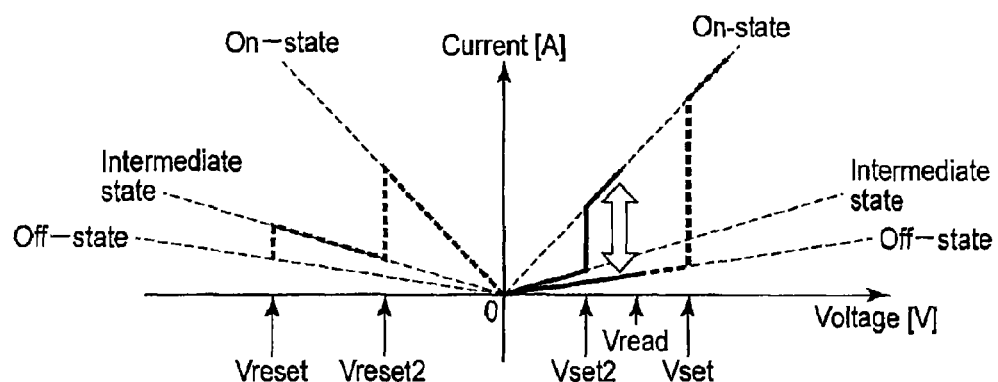
FIGS. 8B and 8C are graphs showing the current-voltage characteristic of the resistance-change element in reading (2) according to the embodiment.
Figure 8C:
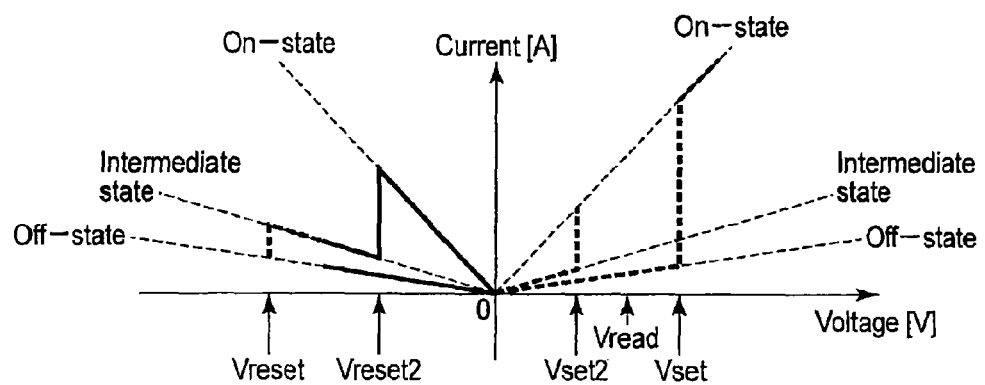

As shown in FIG. 8B, in reading, a positive voltage greater than or equal to Vset2 and less than Vset is applied as a voltage pulse of voltage pulse condition A. Subsequently, as shown in FIG. 8C, a negative voltage greater than or equal to |Vreset2| and less than |Vreset| is applied as a voltage pulse of voltage pulse condition B.

When a resistance-change element targeted for reading is in the intermediate state (when the resistance-change element is an element in which data has been written), the resistance-change element instantaneously makes the transition to the on-state from the intermediate state if the positive voltage is applied thereto, and a current in the on-state is read. Subsequently, the negative voltage is applied, and the resistance-change element makes the transition to the intermediate state from the on-state.

When the resistance-change element targeted for reading is in the off-state (when the resistance-change element is an element in which data has been erased), the resistance-change element maintains the off-state, and a current in the off-state is read. Subsequently, the negative voltage is applied, but the resistance-change element in the off-state remains in the off-state.

FIG. 4A summarizes the relationship between the state transition and the voltage pulse conditions in the operations according to the embodiment described above.

The voltages are only used as the conditions of the operations in the above explanation. Therefore, these operations are used for the resistance-change element which has the state transition depending on voltage rather than time or depending on both voltage and time.

[4] Advantages

According to the first embodiment, the resistance-change elements separate into the on-state and the off-state that have a great current difference in reading. However, except for reading, the element in which data has been written and the element in which data has been erased are both in the intermediate state or the off-state, and a suppressed current runs through the resistance-change elements.

Since the resistance-change element is always kept in a state higher in resistance than the on-state except for reading, a sneak current running through unselected memory cells can be suppressed. That is, all the resistance-change elements but the selected resistance-change element targeted for reading are in a current-suppressed condition, and have a function substantially equivalent to that of a memory cell equipped with a selector.

Furthermore, according to the first embodiment, it is possible to provide a bipolar resistance-change memory which substantially enables a selector function without the installation of a selector in each memory cell and which can avoid an increased operating voltage, a complicated process, and increased costs.

Second Embodiment

A resistance-change memory according to the second embodiment is described. In the case described in the second embodiment, an ion-conducting resistance-change memory is provided as a memory cell. It is to be noted that the structure of a memory cell array is similar to that according to the first embodiment and is therefore not described.

[1] Resistance-Change Element

For example, an ion-conducting resistance-change memory is used as a resistance-change element. The ion-conducting resistance-change memory is described below in detail.

Figure 9:
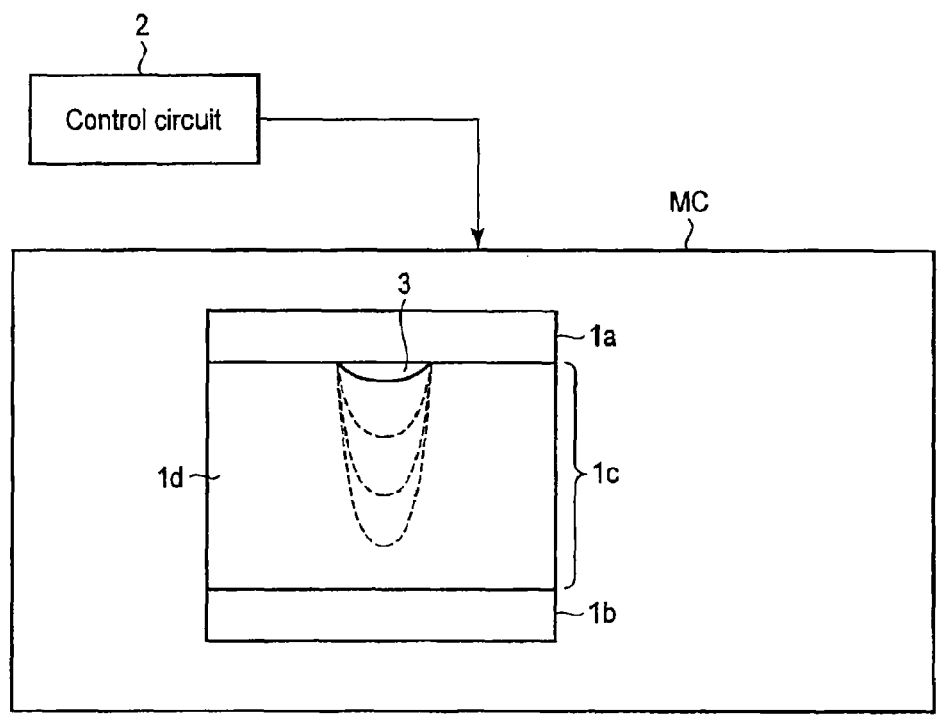
FIG. 9 is a diagram showing the configuration of an ion-conducting resistance-change element according to the embodiment.

FIG. 9 is a diagram showing the configuration of the ion-conducting resistance-change element.

A resistance-change element MC comprises a first electrode 1a and a second electrode 1b, and a variable resistance layer 1c disposed between the first electrode 1a and the second electrode 1b. The variable resistance layer 1c has a filament 3 formed between the first electrode 1a and the second electrode 1b.

Here, the shape, for example, the length and thickness of the filament 3 in an on-state is at least greater than the shape, for example, the length and thickness of a filament in an off-state.

A control circuit 2 applies a voltage between the first electrode 1a and the second electrode 1b to perform writing, erasing, or reading.

A high-resistance material 1d comprises, for example, amorphous silicon, polycrystalline silicon, or a metal sulfide ($Cu_2S$, AgS). The high-resistance material 1d may comprise an insulator.

One of the first electrode 1a and the second electrode 1b functions as a lower electrode, and the other functions as an upper electrode, for example. The lower electrode is an electrode that serves as a foundation for forming the variable resistance layer 1c. The upper electrode is an electrode that is formed after the variable resistance layer 1c is formed.

As shown, the filament 3 may extend from the first electrode 1a, or may extend from the second electrode 1b.

A specific example of the ion-conducting resistance-change element is described below.

In the resistance-change element MC shown by way of example in FIG. 9, the first electrode (upper electrode) 1a is made of a nickel (Ni) layer, the second electrode (lower electrode) 1b is made of a p+-type silicon layer, and the variable resistance layer 1c is made of an amorphous silicon layer.

Figure 10A:
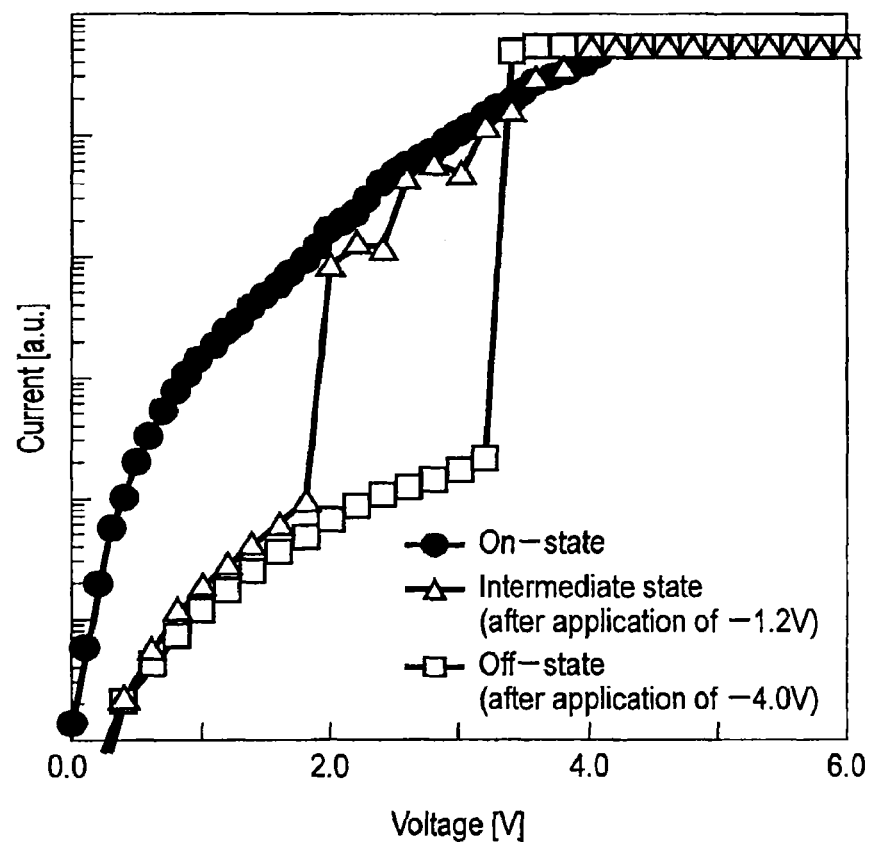
FIG. 10A is a graph showing the current-voltage characteristic of the resistance-change element shown in FIG. 9.
Figure 10B:
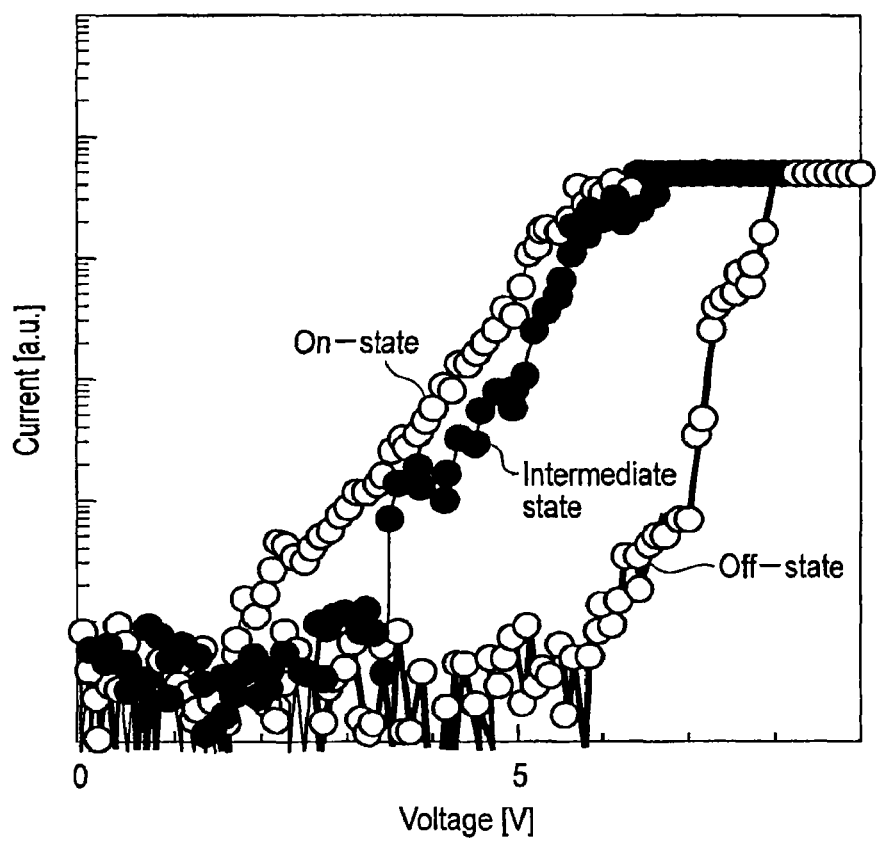
FIG. 10B is a graph showing the current-voltage characteristic of another resistance-change element shown in FIG. 9.

FIG. 10A shows the current-voltage characteristic of the resistance-change element MC when the first electrode (upper electrode) 1a is a silver (Ag) layer. FIG. 10B shows the current-voltage characteristic of the resistance-change element MC when the first electrode 1a is a nickel (Ni) layer. In each graph, the vertical axis is logarithmically indicated.

The current-voltage characteristics when the resistance-change element is in the on-state, the off-state, and the intermediate state are shown. The example shown in FIG. 10B is specifically described. The intermediate state shows the current-voltage characteristic after a voltage Vreset2 of about −2 V (referred to as a "weak erase voltage") is applied to the resistance-change element in the on-state to make the transition to the intermediate state. The resistance-change element in the intermediate state makes the transition to the on-state when a voltage of about 3.6 V is applied thereto, and shows characteristics substantially similar to the characteristics of a resistance-change element originally in the on-state. The resistance-change element in the off-state makes the transition to the on-state from the off-state when a voltage of about 8 V is applied thereto.

FIG. 11A shows the relationship between the weak erase voltage and a voltage necessary for the resistance-change element to make the transition to the on-state after the weak erase voltage is applied to the resistance-change element in the on-state, when the first electrode (upper electrode) 1a is a nickel (Ni) layer. FIG. 11B shows the weak erase voltage dependence of a current when reading is performed in the resistance-change element by 3 V after the application of the weak erase voltage to the resistance-change element in the on-state. The vertical axis in FIG. 11B is logarithmically indicated.

As shown in FIG. 10B, the voltage necessary to bring the resistance-change element to the on-state decreases to about 3.6 V from 8 V by the application of a weak erase voltage of about −2 V to the resistance-change element in the on-state. Further, in a voltage region less than or equal to 3.6 V, the intermediate state having a current lower than the current (on current) of the on-state is achieved.

[2] Writing, Erasing, and Reading

Write, erase, and read operations when the resistance-change elements having the characteristics shown in FIG. 10B, FIG. 11A, and FIG. 11B are used as memory cells are specifically described in connection with a 3×3 memory cell array by way of example. The control circuit 2 applies the following voltage pulses to the resistance-change element MC in the write, erase, and read operations.

(1) Writing

Figure 12:
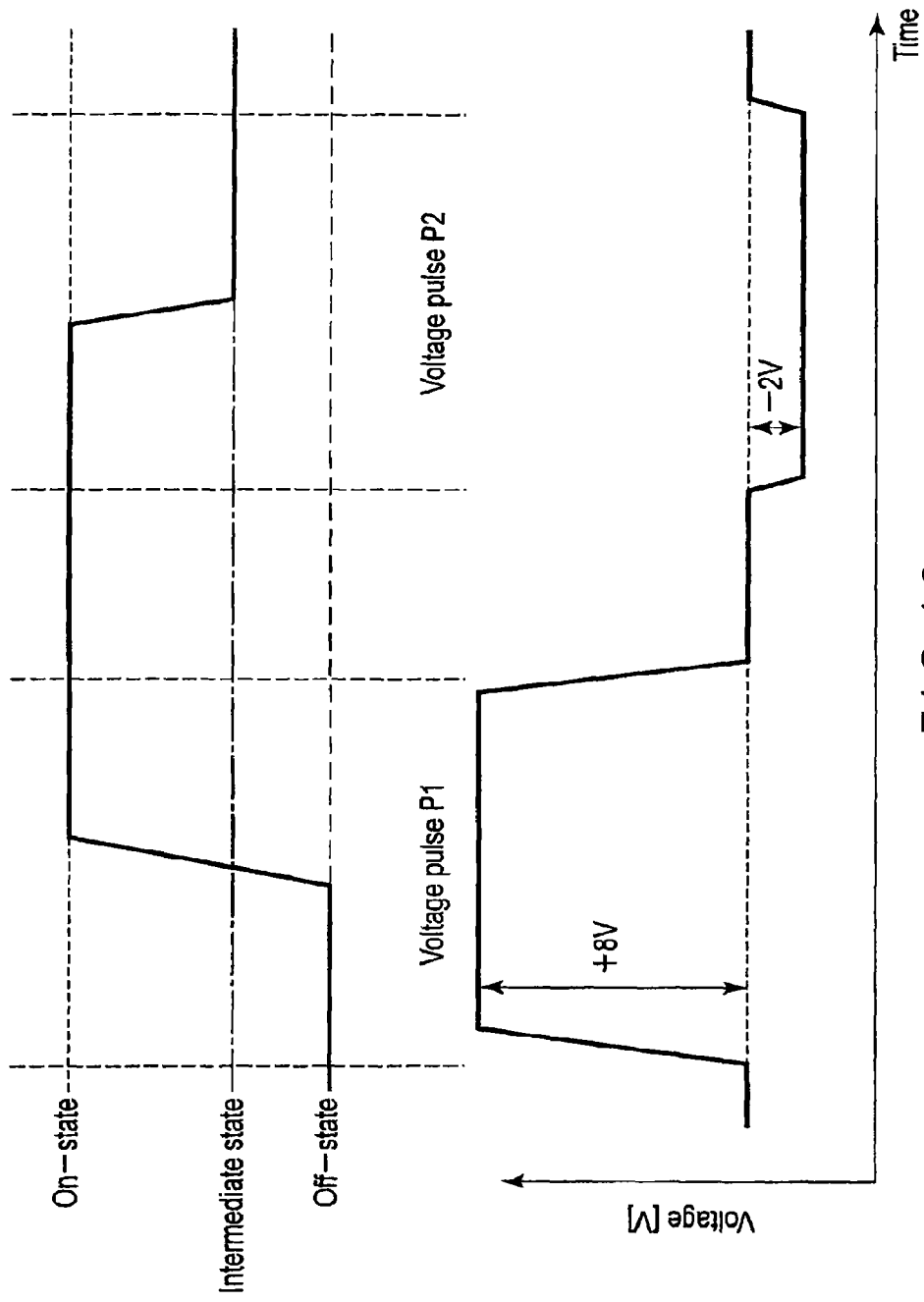
FIG. 12 is a graph showing the state transition of the resistance-change element and an applied voltage in writing according to the embodiment.

FIG. 12 is a graph showing the state transition of the resistance-change element in writing and an applied voltage.

As shown, a voltage pulse P1 is applied to a selected resistance-change element, and then a voltage pulse P2 is applied. The voltage (pulse amplitude) of voltage pulse P1 is, for example, 8 V, and the voltage of voltage pulse P2 is, for example, −2 V.

When voltage pulse P1 is applied, the resistance-change element makes the transition to the on-state from the off-state. Further, when voltage pulse P2 is applied, the resistance-change element makes the transition to the intermediate state from the on-state.

FIG. 13A and FIG. 13B are diagrams showing write operations in the memory cell array.

As shown in FIG. 13A, a voltage pulse of 8 V is applied to a selected word line WL2, and a voltage pulse of 0 V is applied to a selected bit line BL0. As a result, a voltage pulse P1 of +8 V is applied to selected resistance-change element MC(0-2), and resistance-change element MC(0-2) makes the transition to the on-state.

At the same time, a voltage pulse of 3 V is applied to unselected word lines WL1 and WL0, and a voltage pulse of 5 V is applied to unselected bit lines BL1 and BL2. As a result, a voltage pulse of +3 V is applied to unselected resistance-change elements MC(1-2), MC(2-2), MC(0-1), and MC(0-0), respectively. A voltage pulse of −2 V is applied to unselected resistance-change elements MC(1-1), MC(2-1), MC(1-0), and MC(2-0), respectively. In each case, the states of the unselected resistance-change elements do not change.

Furthermore, as shown in FIG. 13B, a voltage pulse of 0 V is applied to selected word line WL2, and a voltage pulse of 2 V is applied to selected bit line BL0. As a result, a voltage pulse P2 of −2 V is applied to selected resistance-change element MC(0-2), and resistance-change element MC(0-2) makes the transition to an intermediate state from the on-state.

At the same time, a voltage pulse of 1 V is applied to unselected word lines WL1 and WL0 and unselected bit lines BL1 and BL2. As a result, a voltage pulse of −1 V is applied to unselected resistance-change elements MC(1-2), MC(2-2), MC(0-1), and MC(0-0), respectively. A voltage pulse of 0 V is applied to unselected resistance-change elements MC(1-1), MC(2-1), MC(1-0), and MC(2-0), respectively. In each case, the states of the unselected resistance-change elements do not change.

The writing described above allows the selected resistance-change element alone to make the transition to the intermediate state.

(2) Erasing

FIG. 14 is a graph showing the state transition of the resistance-change element in erasing and an applied voltage.

As shown, a voltage pulse P3 is applied to a selected resistance-change element. When voltage pulse P3 is applied, the resistance-change element makes the transition to the off-state from the intermediate state. The voltage (pulse amplitude) of voltage pulse P3 is, for example, −5 V. The product of the pulse amplitude and pulse width of voltage pulse P3 is greater than the product of the pulse amplitude and pulse width of voltage pulse P2.

FIG. 15 is a diagram showing an erase operation in the memory cell array.

As shown, a voltage pulse of 0 V is applied to a selected word line WL2, and a voltage pulse of 5 V is applied to a selected bit line BL0. As a result, a voltage pulse P3 of −5 V is applied to selected resistance-change element MC(0-2), and resistance-change element MC(0-2) makes the transition to the off-state.

At the same time, a voltage pulse of 3.0 V is applied to unselected word lines WL1 and WL0, and a voltage pulse of 2.0 V is applied to unselected bit lines BL1 and BL2. As a result, a voltage pulse of −2.0 V is applied to unselected resistance-change elements MC(1-2), MC(2-2), MC(0-1), and MC(0-0), respectively. A voltage pulse of 1.0 V is applied to unselected resistance-change elements MC(1-1), MC(2-1), MC(1-0), and MC(2-0), respectively. In each case, the states of the unselected resistance-change elements do not change.

The erasing described above allows the selected resistance-change element alone to make the transition to the off-state.

(3) Reading

FIG. 16 is a graph showing the state transition of the resistance-change element in reading and an applied voltage.

As shown, a voltage pulse P4 is applied to a selected resistance-change element, and then a voltage pulse P2 is applied. The voltage (pulse amplitude) of voltage pulse P4 is, for example, +4 V, and the voltage of voltage pulse P2 is, for example, −2 V. The product of the pulse amplitude and pulse width of voltage pulse P4 is smaller than the product of the pulse amplitude and pulse width of voltage pulse P1. Voltage pulse P4 is greater than voltage pulse P1 in at least one of pulse amplitude and pulse width.

When voltage pulse P4 is applied, the resistance-change element makes the transition to the on-state from the intermediate state. Further, when voltage pulse P2 is applied, the resistance-change element makes the transition to the intermediate state from the on-state.

FIG. 17A and FIG. 17B are diagrams showing read operations in the memory cell array.

As shown in FIG. 17A, a voltage pulse of 4 V is applied to a selected word line WL2, and a voltage pulse of 0 V is applied to a selected bit line BL0. As a result, a voltage pulse P4 of +4 V is applied to selected resistance-change element MC(0-2), and resistance-change element MC(0-2), when in the intermediate state, makes the transition to the on-state. The on-state of resistance-change element MC(0-2) is then read. When selected resistance-change element MC(0-2) is in the off-state, the resistance-change element does not change its state, and the off-state is read.

At the same time, a voltage pulse of 2 V is applied to unselected word lines WL1 and WL0 and unselected bit lines BL1 and BL2. As a result, a voltage pulse of +2 V is applied to unselected resistance-change elements MC(1-2), MC(2-2), MC(0-1), and MC(0-0), respectively. A voltage pulse of 0 V is applied to unselected resistance-change elements MC(1-1), MC(2-1), MC(1-0), and MC(2-0), respectively. In each case, the states of the unselected resistance-change elements do not change.

Furthermore, as shown in FIG. 17B, a voltage pulse of 0 V is applied to selected word line WL2, and a voltage pulse of 2 V is applied to selected bit line BL0. As a result, a voltage pulse P2 of −2 V is applied to selected resistance-change element MC(0-2), and resistance-change element MC(0-2), when in the on-state, makes the transition to the intermediate state from the on-state. On the other hand, when resistance-change element MC(0-2) is in the off-state, the resistance-change element does not change its state.

At the same time, a voltage pulse of 1 V is applied to unselected word lines WL1 and WL0 and unselected bit lines BL1 and BL2. As a result, a voltage pulse of −1 V is applied to unselected resistance-change elements MC(1-2), MC(2-2), MC(0-1), and MC(0-0), respectively. A voltage pulse of 0 V is applied to unselected resistance-change elements MC(1-1), MC(2-1), MC(1-0), and MC(2-0), respectively. In each case, the states of the unselected resistance-change elements do not change.

[3] Advantages

The cross-point memory cell array has the following general problem.

As shown in FIG. 18, when memory cell MC(0-2) is selectively read, a sneak current actually runs through a path indicated by a dotted line in FIG. 18, so that it becomes difficult to determine the state of memory cell MC(0-2).

Since the sneak current always runs through the memory cell in the reverse direction, a selector that suppresses the reverse current has heretofore been installed in the resistance-change element in each memory cell to solve this problem. According to the present embodiment, the reverse current is suppressed without the installation of the selector as described above, so that this problem can be avoided.

In the present embodiment, the intermediate state of the resistance-change element is higher in resistance than the on-state, and the transition from this intermediate state to the on-state can be made by a voltage lower than a voltage necessary for the transition to the on-state from the off-state. By using, as a read voltage, a voltage which is less than the voltage for the transition to the on-state from the off-state and which is greater than or equal to the voltage for the transition to the on-state from the intermediate state, currents in low-voltage regions in the reverse and forward directions are suppressed without decreasing the on/off ratio. Accordingly, the resistance-change element can obtain substantially the same characteristics as a memory cell equipped with a selector.

Moreover, whether a selected resistance-change element is in the intermediate state or off-state can be determined by a current in the on-state or off-state. Even when the resistance-change element makes the transition to the on-state from the intermediate state in a nonvolatile manner under voltage pulse condition A, the resistance-change element can be returned to the intermediate state by successively applying voltage pulse condition B, and information before reading is not lost.

Figure 21:
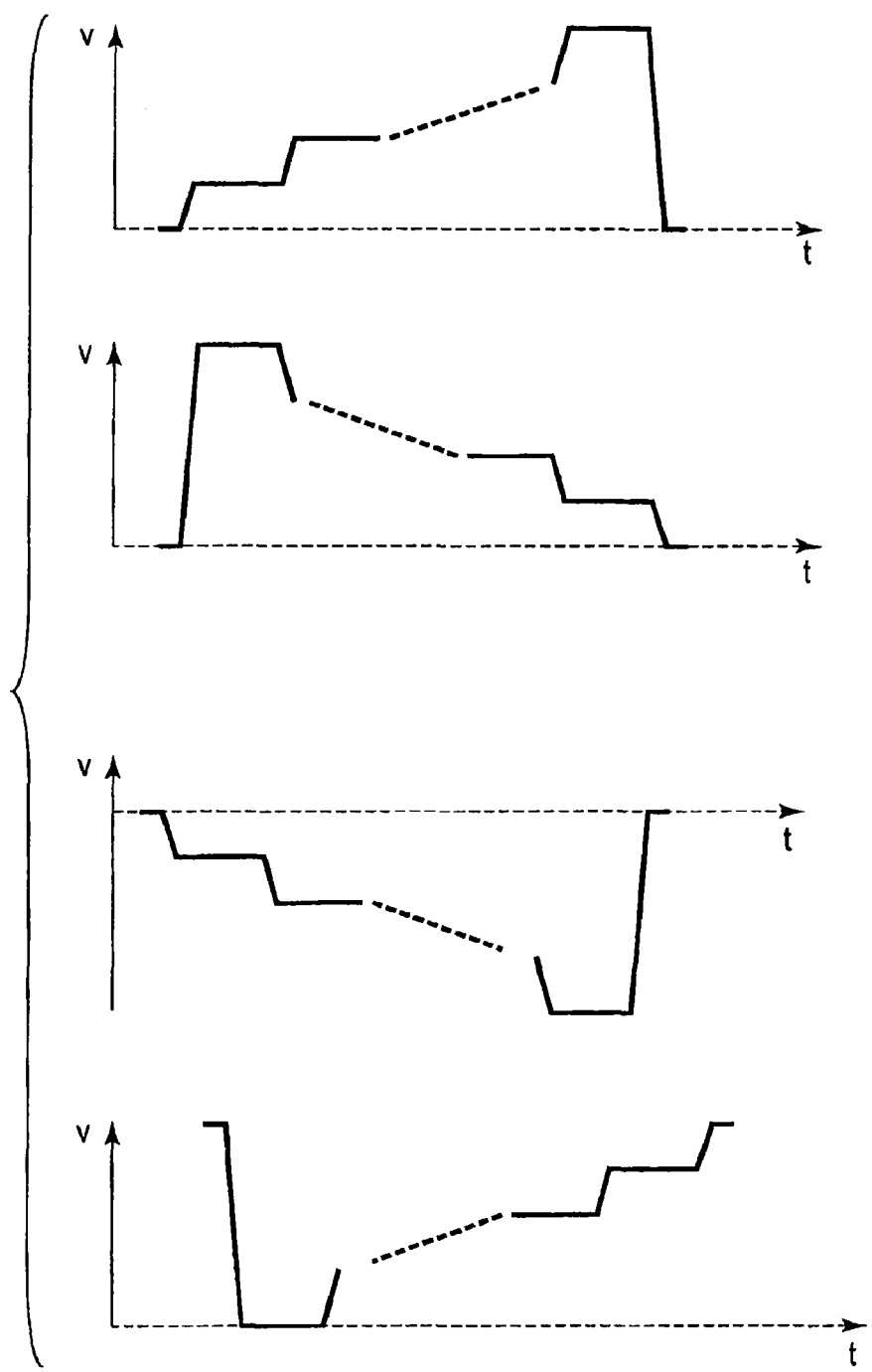

Although each of voltage pulses P1, P2, P3, and P4 comprises a single voltage pulse in the present embodiment described, the present embodiment can be implemented by various voltage waveforms as long as voltage pulses P1, P2, P3, and P4 satisfy above-mentioned voltage pulse conditions 1, B, 3, and A. For example, as shown in FIG. 19 and FIG. 20, the voltage pulses may comprise voltage pulses of different amplitudes or voltage pulses of the same amplitude. As shown in FIG. 21, the voltage pulses may comprise stepped voltage pulses.

As described above, according to the embodiments, it is possible to provide a resistance-change memory which can suppress the sneak current running through the unselected memory cells without the installation of a selector in the memory cell.

Moreover, a function substantially similar to that when the resistance-change element and a selector are connected in series can be obtained without the installation of a selector in each memory cell. Therefore, it is possible to avoid problems such as an increased operating voltage, a complicated process, and increased costs that are caused when a selector is actually connected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A resistance-change memory comprising:
   a memory cell which comprises first and second electrodes, and a variable resistance layer disposed between the first electrode and the second electrode; and
   a control circuit which applies a voltage between the first electrode and the second electrode to perform writing, erasing, and reading,
   wherein during the writing, the control circuit applies a first voltage pulse between the first electrode and the second electrode,
   wherein during the reading, the control circuit applies a second voltage pulse between the first electrode and the second electrode, the second voltage pulse having a same polarity as the first voltage pulse, a product of a pulse amplitude and a pulse width of the second voltage pulse being smaller than a product of a pulse amplitude and a pulse width of the first voltage pulse, and the variable resistance layer in an intermediate state transitions to an on-state by applying the second voltage pulse, a resistance of the intermediate state being greater than a resistance of the on-state, and the resistance of the intermediate state being smaller than a resistance of an off-state,
   wherein during the reading, the control circuit applies a third voltage pulse between the first electrode and the second electrode after applying the second voltage pulse, the third voltage pulse having a different polarity from the first voltage pulse, and the variable resistance layer in the on-state transitions to the intermediate state by applying the third voltage pulse.

2. The resistance-change memory according to claim 1, wherein
   during the erasing, the control circuit applies a fourth voltage pulse between the first electrode and the second electrode, the fourth voltage pulse having a same polarity as the third voltage pulse, a product of a pulse amplitude and a pulse width of the fourth voltage pulse being greater than a product of a pulse amplitude and a pulse width of the third voltage pulse.

3. The resistance-change memory according to claim 1, wherein
   the variable resistance layer comprises a metal filament disposed between the first electrode and the second electrode.

4. The resistance-change memory according to claim 3, wherein
   the metal filament is at least one of longer or thicker in the on-state than in the off-state.

5. The resistance-change memory according to claim 1, wherein
   the variable resistance layer comprises an insulator.

6. The resistance-change memory according to claim 1, wherein
   the variable resistance layer comprises at least one of amorphous silicon, polycrystalline silicon, or a metal sulfide.

7. The resistance-change memory according to claim 1, further comprising a word line and a bit line arranged to intersect with each other,
   wherein the memory cell is disposed at the intersection of the word line and the bit line.

* * * * *